Figure 1:
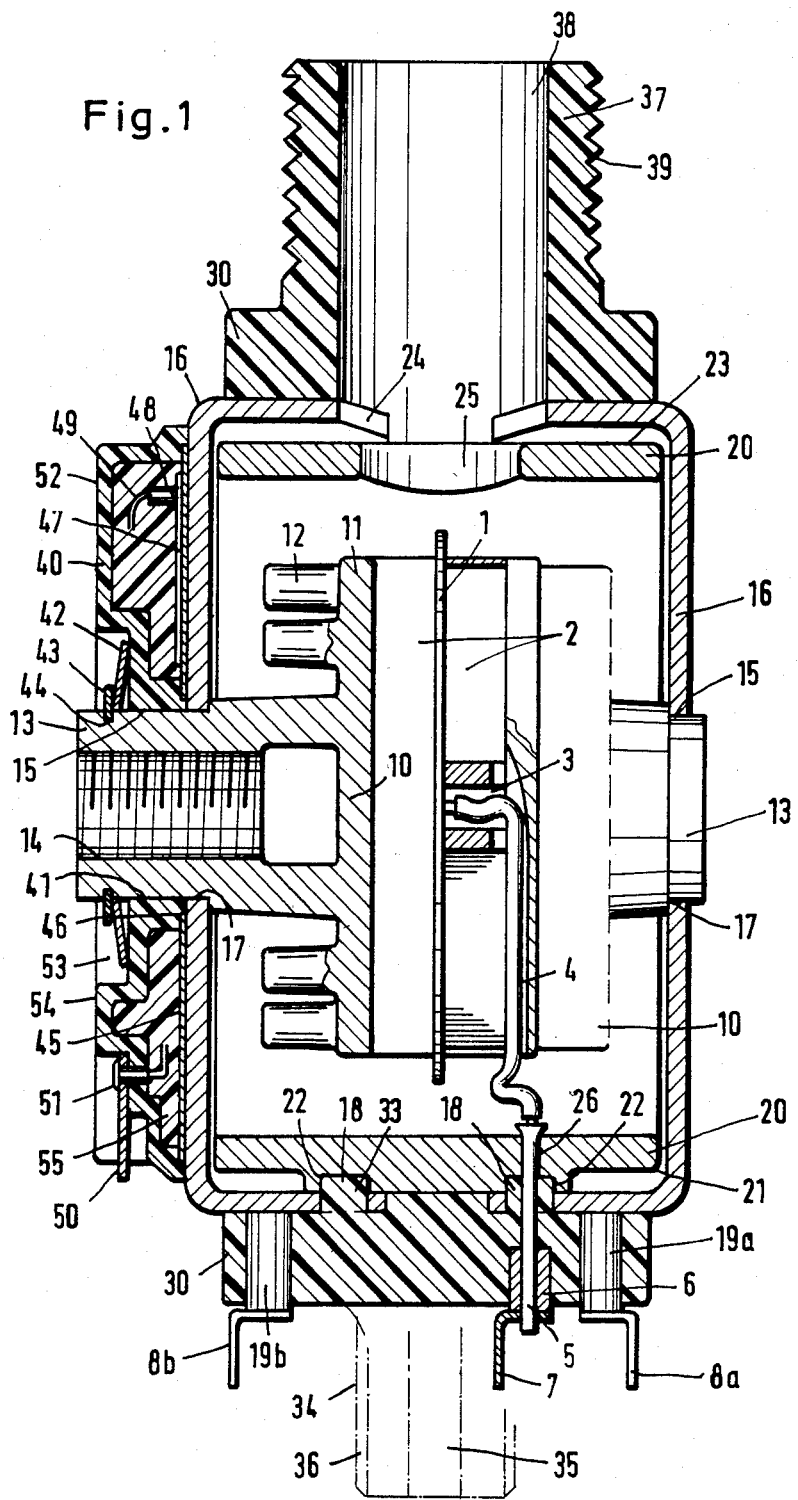

United States Patent [19]

Klein

[11] Patent Number: 4,520,384

[45] Date of Patent: May 28, 1985

[54] POWER SEMICONDUCTOR COMPONENT FOR COOLING BY BOILING OR LIQUIDS

[75] Inventor: Erwin Klein, Heddesheim, Fed. Rep. of Germany

[73] Assignee: BBC Aktiengesellschaft Brown, Boveri & Cie., Baden, Switzerland

[21] Appl. No.: 419,398

[22] Filed: Sep. 17, 1982

[30] Foreign Application Priority Data

Sep. 19, 1981 [DE] Fed. Rep. of Germany ....... 3137408

[51] Int. Cl.³ .................... H01L 23/34; H01L 23/46
[52] U.S. Cl. ......................................... 357/82; 357/81
[58] Field of Search ............... 357/82, 81; 165/80 C, 165/80 E

[56] References Cited

U.S. PATENT DOCUMENTS 3,823,771 7/1974 Ludwig ................................. 357/82
4,374,393 2/1983 Kamahara ........................... 357/80

FOREIGN PATENT DOCUMENTS 155774 12/1979 Japan ..................................... 357/82
1076237 7/1967 United Kingdom .................. 357/82

Primary Examiner—Andrew J. James
Assistant Examiner—Sheila V. Clark
Attorney, Agent, or Firm—Herbert L. Lerner; Laurence A. Greenberg

[57] ABSTRACT

A power semiconductor component for boiling cooling or liquid cooling includes a semiconductor crystal disc having two main electrodes and, optionally, one or more control electrodes. The disc is built into a liquid and gas-tight housing through which an electrically insulating coolant can flow. The housing is formed substantially of a ceramic sleeve with metallic covers which are disposed on both sides and the metallic covers are directly acted upon by the coolant. Electric circuitry, especially resistors and diodes, are integrated in a circuitry module which is in force-locking thermal contact with the metallic cover of the power semiconductor component.

11 Claims, 3 Drawing Figures

POWER SEMICONDUCTOR COMPONENT FOR COOLING BY BOILING OR LIQUIDS

The invention relates to a power semiconductor component for boiling or liquid cooling including a semiconductor crystal disc having two main electrodes and, optionally, one or more control electrodes, the disc being built into a liquid and gas-tight housing through which an electrically insulating coolant can flow, the housing being formed substantially of a ceramic sleeve with metallic covers which are disposed on both sides and the metallic covers being directly acted upon by the coolant.

Such a power semiconductor component for boiling or liquid cooling is known from German Published, Non-Prosecuted Application DE-OS No. 29 38 096. There, the main electrodes are connected to electric multicontacts which serve exclusively for carrying the current and which partially pierce the outer wall of the housing so as to load-relieve the semiconductor crystal disc mechanically and thermally to the largest degree possible.

Semiconductors of the silicon type must be provided with carrier storage effect circuitry. If several such semiconductor elements are connected electrically in series, they also require circuitry for electric voltage division.

The resistors of this electric circuitry have considerable dissipation losses, especially when the power semiconductor components are used in inverters for higher frequencies, which results in large overall dimensions if the circuits are air-cooled. If the circuits are liquid-cooled, the overall dimensions are smaller but the expenditures (costs) are higher.

It is an object of the invention to describe in a power semiconductor component for boiling cooling or liquid cooling of the type mentioned at the outset, a simple and cost-effective possibility of installation for a required electric circuit.

This problem is solved by providing electric circuitry, especially resistors and diodes, integrated in a circuitry module which is in force-locking thermal contact with the metallic cover of the power semiconductor component.

The advantages attainable with the invention are in particular that the dissipation heat produced in the electric circuitry during operation can be removed via the cooling device of the power semiconductor component itself. Advantageously, no additional cooling device is necessary. Due to the intensive cooling effect of the boiling cooling or the liquid cooling, the electric components of the circuitry can be made small and thereby cost-effective.

Advantageous further embodiments of the invention are characterized in the subclaims.

The invention will be explained in the following with the aid of the embodiment example shown in the drawings, where FIG. 1 shows the power semiconductor component with an integrated circuitry module in a cross-sectional side view, FIG. 2 the power semiconductor element in a partially cross-sectional top view, and FIG. 3 an electric circuitry module.

In FIG. 1 the power semiconductor component for boiling cooling with an integrated circuitry module is shown in a cross-sectional side view. A semiconductor crystal disc 1 contained in the interior of the power semiconductor component is connected via multicontacts 2 (multi-spring contacts) to heat sinks 10 on both sides by means of substance-joining connections (soldering). Each of the two heat sinks 10 consists of a bottom 11 which carries cooling rods 12 for enlarging the surface. For electrically connecting the semiconductor component, a connecting eye 13 with internal thread 14 is formed-on centrically at each heat sink 10, the connecting eye 13 being provided on the outside with a lathe cut 15. On each of these cuts 15, a cup-like metallic cover 16 is fastened with material contact via its central hole 17.

Before the individual parts: semiconductor crystal disc 1, multicontact 2, heat sink 10 and cover 16 of the power semiconductor component are joined together, a ceramic sleeve 20 is placed between the two covers 16. This sleeve 20 is provided on both sides with external lathe cuts 21, several smaller blind holes 22, a flat 23 and two larger holes 25 (only one hole 25 is shown).

An insulating sleeve 30 (of insulating compound) is pressed around the unit which is assembled as described. The insulating sleeve 30 provides the necessary external insulation of the power semiconductor component. In addition, the insulating sleeve 30 establishes the mechanical connection between the metallic covers 16, so that the substance-joining connections are advantageously relieved of tension. To this end, the metallic covers 16 are provided with holes 18 and ceramic sleeves 20 with the blind holes 22, in which the insulating compound of the insulating sleeve 30 is anchored during the molding process with bumps 33. The insulating sleeve 30 has a stub 34 with a central hole 35 (for the refrigerant supply) and the thread 36 formed thereon, as well as a diametrically opposite stub 37 with the hole 38 (for the coolant discharge) and an external thread 39. These stubs 34, 37 serve, as mentioned above, for feeding and discharging liquid or gaseous coolant. In order to permit the gaseous coolant to pass into the hole 38 uninhibited, the metallic covers 16 are provided with partially circular cutouts 24.

For designing the power semiconductor component of the type described as a thyristor, a gate terminal line 4 is brought through a hole 3 of the multicontact 2 for making contact with the semiconductor crystal disc 1. The external gate connection is made by means of a contact pin 5 which is fixed in a hole 26 of the ceramic sleeve 20. The contact pin 5 is anchored by means of a jack 6 in the insulating sleeve 30. At the outer end of the contact pin 5 a flat plug 7 is fastened. An auxiliary cathode contact of the thyristor is made via a metallic bolt 19a which is welded to the cover 16 of the semiconductor component on the cathode side and carries an external flat plug 8a. An auxiliary anode contact is made in a similar manner via a metallic bolt 19b which is welded to the metallic cover 16 on the anode side and carries an external flat plug 8b.

An electric circuitry module 40 is integrated with the power semiconductor component. The circuitry module 40 has the shape of a flat cylinder and has a central hole 41. For assembly, the circuitry module 40 is pressed with its central hole 41 on the cut 15 of the connecting eye 13. For making a force-locking thermal contact of the circuitry module 40 on the metallic cover 16 to which coolant is admitted, a spring 42 is subsequently pressed on the connecting eye 13 and is fixed by means of a securing ring 43. In this manner, the dissipation heat produced in the circuitry module can be conducted into the coolant. The securing ring 43 engages in a slot 44 of the connecting eye 13.

The circuitry module consists of a ceramic substrate 45 in the form of a circular disc which has a central hole 46. The ceramic substrate 45 has resistors 47 applied thereon by means of thin or thick-film technology or they may also be in the form of metallic foils. Diodes which may be necessary for the circuit are fastened without a case on the ceramic substrate 45 by means of adhesive (not shown). For the electrical contacts of these circuitry elements, solder pins 48 are provided. These are electrically connected via wires 49 to the external terminals which are present as flat plugs and are fastened by means of rivets 51 at the plastic housing 52.

The circuitry module 40 is covered up by means of a plastic housing 52 which has the already mentioned hole 41 and a cup-shaped depression 53. The cup-shaped depression 53 serves for receiving the spring 42 as well as the securing ring 43. Corresponding ribs 54 at the plastic housing 52 establish the necessary leakage and air paths between the different electric potentials at the connecting eye 13 and the covers 16 and the flat plug contacts 50.

After the individual parts are assembled, a highly temperatureresistant filler 55, for instance, of silicone resin, is sprayed between the housing 52 and the substrate 45 via a hole, not shown, in the plastic housing 52, which ensures that the force supplied by the spring 42 via the housing 52 is transmitted and distributed uniformly to the substrate 45 for making proper thermal contact with the metallic cover 16.

The electrical connections from the circuitry module 40 to the anode and cathode of the power semiconductor component are made via wires, not shown, to the flat plug contacts 8a, 8b which are in contact with the covers 16 via the metallic bolts 19a, 19b.

Figure 2:
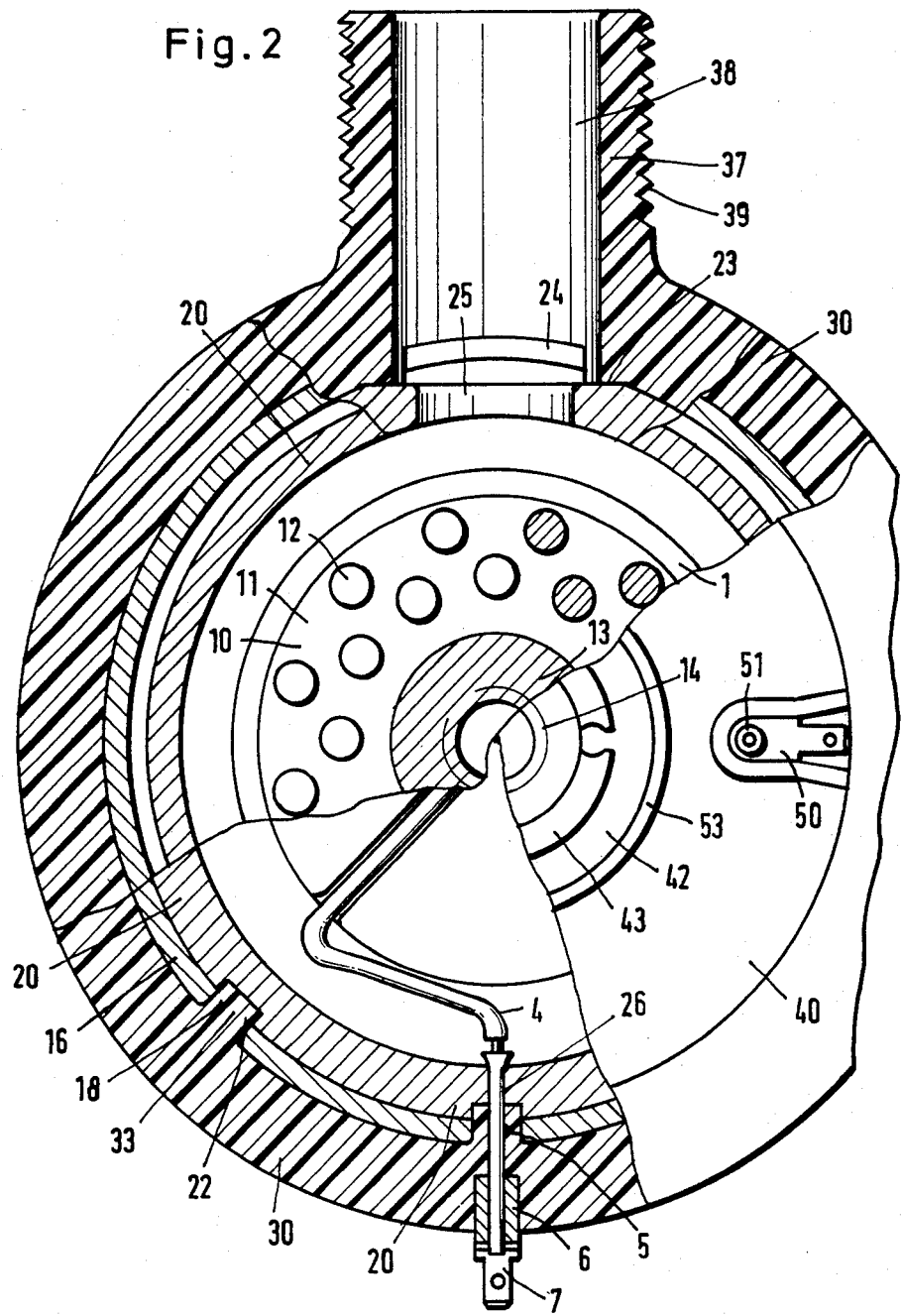

In FIG. 2, the power semiconductor component is shown in a partly cross-sectional top view. In detail may be seen here the radial design of the element with the central semiconductor crystal disc 1, the heat sinks 10 (with the bottom 11 and cooling rods 12) arranged thereon with the ceramic sleeve 20 following toward the outside, the metallic covers 16 and insulating sleeve 30.

There may further be seen the anchors between the ceramic sleeve 20 and the insulating sleeve 30 by way of the bumps 33 which engage through the holes 18 of the metallic covers 16 in the blind hole 22 of the ceramic sleeve 20.

There may further be seen the gate connection via the contact pin 5 which is anchored in the insulating sleeve 30 by means of the jack 6 and is brought through a hole in the metallic cover 16 and the hole 26 through the ceramic sleeve 20, where the contact pin 5 is connected externally to the flat plug 7 and internally to the gate connection line 4.

In FIG. 2 are further shown the connecting eye 13 with the internal thread 14 to connect the power semiconductor component electrically as well as the refrigerant discharge via the stub 37 with external thread 39, of the insulating sleeve 30. The coolant discharge is through the hole 25 in the ceramic sleeve 20 at the point of the flat 23, and further via the partly circular cutout 24 of the metallic covers 16 through the hole of the stub 37.

Finally, the circuitry module 40 is shown with the securing ring 43, the spring 42, the cup-shaped depression 53, the flat plug 50 and the rivet 51.

Figure 3:
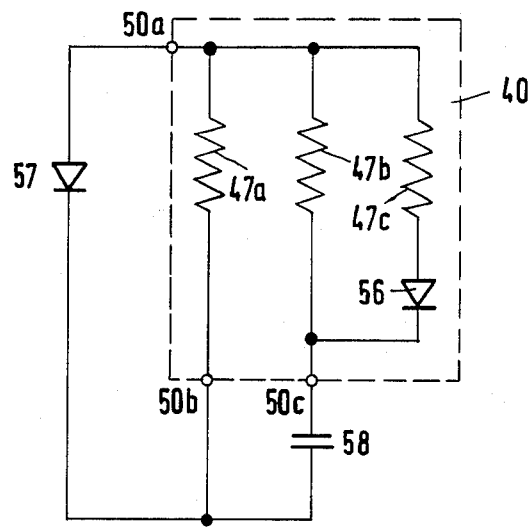

In FIG. 3, the electrical design of a circuitry module 40, and specifically of a resistor-diode module is shown. The circuitry module 40 has three parallel-connected resistors 47a, 47b, 47c (for instance, in thin or thick-film technology). The series circuit consisting of the resistor 47c and a blocking diode 56 which is likewise built into the module itself, is shunted across the resistor 47b. The resistor 47a is shunted across the power semiconductor component, a thyristor 57. Across the thyristor 57 is likewise shunted the series circuit of the resistor 47b and a capacitor 58. While the resistors 47a, 47b, 47c and the blocking diode 56 are part of the circuitry module 40 which is integrated with the power semiconductor component, the capacitor 58 is mounted externally. This specific circuitry module 40 is equipped with three flat plugs 50a, 50b, 50c, the flat plug 50a being connected to the anode, the flat plug 50b to the cathode and the flat plug 50c to the capacitor 58.

Different embodiments of the multicontacts 2 are known from the already mentioned DE-OS No. 29 38 096 as well as from DE-OS No. 28 55 493 and DE-OS No. 29 37 049.

I claim:

1. Power semiconductor component for boiling cooling or liquid cooling, comprising a semiconductor crystal disc having two main electrodes and, optionally, one or more control electrodes, a liquid and gas-tight housing through which an electrically insulating coolant can flow, the housing including a ceramic sleeve with metallic covers disposed on both sides thereof, the housing completely surrounding said disc and the metallic covers being acted upon by the coolant directly, and electric circuitry with high dissipation heat, especially resistors and diodes, integrated in a circuitry module (40) which is in force-locking thermal contact with the outside of the metallic cover (16) of the power semiconductor component for cooling.

2. Power semiconductor component according to claim 1, characterize by the feature that the circuitry module (40) consists of a ceramic substrate (45) as a bottom with which thermal contact can be made, and a plastic housing (52) placed thereon.

3. Power semiconductor component according to claim 2, characterized by the feature that resistors (47) in thin-film technology are applied to the ceramic substrate (45).

4. Power semiconductor component according to claim 2, characterized by the feature that resistors (47) in thick-film technology are applied to the ceramic substrate (45).

5. Power semiconductor component according to claim 2, characterized by the feature that resistors (47) in the form of metallic foils are applied to the ceramic substrate (45).

6. Power semiconductor component according to claim 2, characterized by the feature that a diode is fastened on the ceramic substrate (45).

7. Power semiconductor component according to claim 2, characterized by the feature that the ceramic substrate (45) is provided with soldering pins (48) and the plastic housing (52) with riveted-on flat plugs (50) for external electrical connections.

8. Power semiconductor component according to claim 1, wherein the circuitry module (40) has a central hole (41) for slipping it on a connecting eye (13) of the power semiconductor component.

9. Power semiconductor component according to claim 8, characterized by the feature that the plastic housing (52) of the circuitry module (40) has a cup-shaped depression (53) for receiving a spring (42) and a securing ring (43).

10. Power semiconductor component according to claim 9, characterized by the feature that the connecting eye (13) has a slot (44) for receiving the securing ring (43).

11. Power semiconductor component for boiling cooling or liquid cooling in combination with a circuitry module, the power semiconductor component comprising a semiconductor crystal disc having two main electrodes and, optionally, one or more control electrodes, a liquid and gas-tight housing through which an electrically insulating coolant can flow, the housing including a ceramic sleeve with metallic covers disposed on both sides thereof, the housing completely surrounding said disc and the metallic covers being acted upon by the coolant directly, and the circuitry module comprising electric circuitry with high dissipation heat, integrated in the circuitry module which is in force-locking thermal contact with the outside of the metallic cover of the power semiconductor component for cooling.

* * * * *